United States Patent [19]
Pritchett

[11] Patent Number: 5,337,022
[45] Date of Patent: Aug. 9, 1994

[54] HARMONIC LOCK DETECTOR

[75] Inventor: Robert L. Pritchett, East Allen Township, Northampton County, Pa.

[73] Assignee: AT&T Bell Laboratories, Murray Hill, N.J.

[21] Appl. No.: 982,817

[22] Filed: Nov. 30, 1992

[51] Int. Cl.⁵ .............................. H03L 7/00
[52] U.S. Cl. ..................... 331/1 A; 331/64; 331/DIG. 2; 331/17
[58] Field of Search .......... 331/1 A, 4, 16, 17, 331/64, DIG. 2; 307/527, 511, 514

[56] References Cited

U.S. PATENT DOCUMENTS

| | | | |
|---|---|---|---|
| 3,988,696 | 10/1976 | Sharpe | 331/1 A |
| 4,077,016 | 2/1977 | Sanders et al. | 331/4 |
| 4,115,745 | 9/1978 | Egan | 331/17 |
| 4,151,463 | 4/1979 | Kibler | 331/DIG. 2 X |
| 4,590,440 | 7/1984 | Hague et al. | 331/17 |

OTHER PUBLICATIONS

"PLL's Lock Indicator detects Latching Simply" by S. Kirby Electronics Apr. 10, 1980 pp. 127–129.
"How can you be sure that your PLL is really locked in?" by A. Sharpe EDN Feb. 20, 1977 vol. 22, #4. p. 109.

Primary Examiner—Robert J. Pascal
Assistant Examiner—Arnold Kinkead
Attorney, Agent, or Firm—David L. Smith

[57] ABSTRACT

An integrated circuit for detecting harmonic lock of a phase-locked loop includes a frequency synthesizer for receiving a reference clock signal and for generating an oscillator clock signal. A phase generator receives the oscillator clock signal and generates a phase of the oscillator clock signal. A shift register receives as an input the reference clock signal and is clocked by the phase of the oscillator clock signal to produce an output that is a repetitive sequence of logic states. In an alternate embodiment, a harmonic decode circuit decodes the shift register output to determine which harmonic the phase-locked loop has locked onto.

18 Claims, 2 Drawing Sheets

5,337,022

HARMONIC LOCK DETECTOR

TECHNICAL FIELD

This invention relates generally to integrated circuits having a frequency generator and in particular to a harmonic lock detector circuit for detecting whether a frequency generator has locked to a harmonic frequency.

BACKGROUND OF THE INVENTION

Frequency synthesizers are used to expand a clock signal or to generate a high frequency clock signal from a low frequency reference clock signal. Upon being initially powered, frequency synthesizers are permitted to oscillate and settle into a frequency of operation. Frequency synthesizers use a phase-locked loop that includes a phase detector to determine whether the oscillator is operating at the desired clock signal frequency, to adjust the oscillator frequency until the desired clock signal frequency is generated, and to maintain operation of the oscillator at the desired clock signal frequency.

Since the phase detector compares the oscillator generated clock signal to the reference clock signal only at predetermined intervals to ascertain whether the compared signals are aligned, the phase-locked loop of a frequency synthesizer can lock onto a harmonic of the desired clock signal because harmonics of the oscillator generated clock signal exhibit the same characteristics during the predetermined intervals. Alignment of the oscillator generated clock signal with the reference clock signal is a necessary condition, but not a sufficient condition, to be certain that the frequency synthesizer is generating the desired clock signal frequency. A phase-locked loop can appear to be locked on the desired clock signal frequency when being harmonically locked.

Analog circuits to detect harmonic lock are known, but have been unreliable or complex to implement. It is desirable to digitally detect harmonic locking in a manner that is easy to implement and reliable.

SUMMARY OF THE INVENTION

In accordance with an embodiment of the invention, an integrated circuit for detecting harmonic lock of a frequency generator includes a frequency synthesizer for receiving a reference clock signal and for generating an oscillator clock signal. A phase generator receives the oscillator clock signal and generates a phase of the oscillator clock signal. A shift register receives as an input the reference clock signal and is clocked by the phase of the oscillator clock signal to produce an output that is a repetitive sequence of logic states. In an alternate embodiment, a harmonic decode circuit decodes the shift register output to determine which harmonic the phase-locked loop has locked onto.

DETAILED DESCRIPTION

Figure 1:
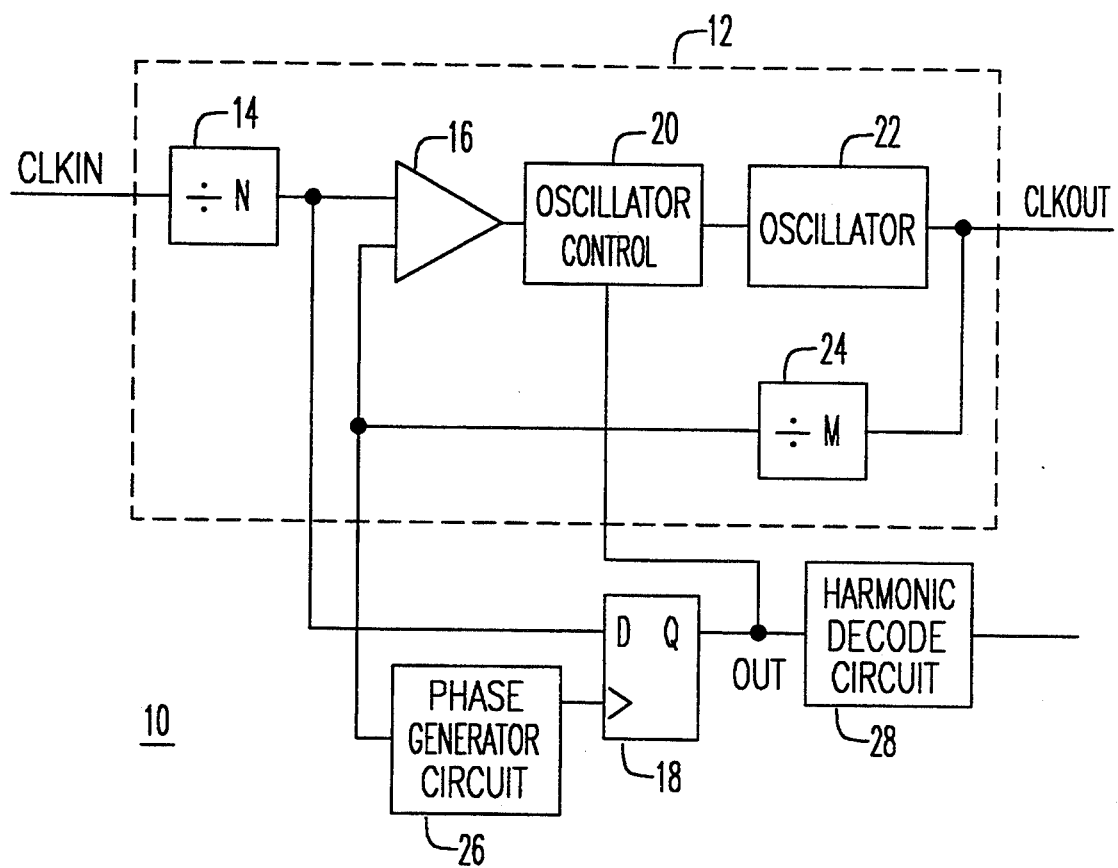
FIG. 1 is a schematic diagram illustrating a phase-locked loop frequency synthesizer with a harmonic lock detector circuit.

Referring to FIG. 1, a schematic diagram illustrating a frequency generation and harmonic lock detector circuit 10. The frequency generation and harmonic lock detector circuit 10 includes a frequency synthesizer phase-locked loop clock generation circuit 12. Clock generation circuit 12 receives a reference clock signal CLKIN at a first frequency as an input and generates an oscillator clock signal CLKOUT at a second frequency as an output. The frequency of the oscillator clock signal is typically higher than the frequency of the reference clock signal.

The reference clock signal is coupled to the input of divide by N counter 14. The output of divide by N counter 14 is coupled to phase detector 16 as a first input and to the D of flip-flop 18. The output of phase detector 16 is coupled to the input of oscillator control 20. The output of oscillator control 20 is coupled to the input of oscillator 22. The output of oscillator 22 is the oscillator clock signal, CLKOUT. The oscillator output is coupled to the clock input of divide by M counter 24. The divide M counter provides an output at the same frequency as the output of the divide by N counter 14. The divide by M counter output is coupled as the second input to phase detector 16 and as the input to phase generator circuit 26. The output of phase generator circuit 26 is coupled as the clock input to flip-flop 18. The output from flip-flop 18 provides the output from the harmonic lock detector circuit 10. Harmonic decode circuit 28 may be present to decode the output of flip-flop 18. The presence of divide by N and divide by M counters represent the general case. When N and M are unity, the circuits may or may not be present.

Figure 2:
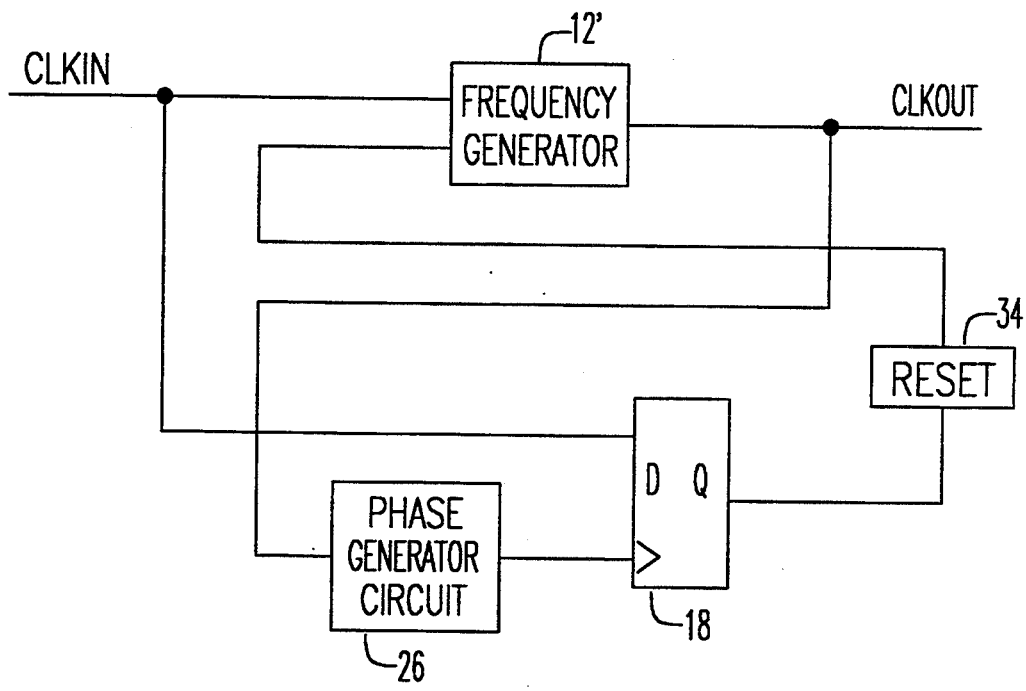
FIG. 2 is a schematic diagram illustrating an alternate embodiment frequency generator with a harmonic lock detector circuit.

FIG. 2 shows an alternate embodiment frequency generator 12' with a harmonic lock detector. The reference clock signal CLKIN provides the D input to flip flop 18. The oscillator clock signal CLKOUT provides the input to the phase generator circuit 26. The output of shift register 18 provides the input to a reset 34 which is used to control frequency generator 12', when the frequency generator locks onto a harmonic frequency, to force the frequency generator 12' out of harmonic lock to a lower frequency of operation.

In operation, parameters M and N are defined based on the frequency of CLKIN and the desired frequency of CLKOUT. As is known in the art, the oscillator clock signal is generated to clock integrated circuits on a circuit board on which the integrated circuit containing the harmonic lock detector circuit is mounted. The oscillator clock signal has a frequency of (M/N) multiplied times the frequency of CLKIN when the phase-locked loop is locked to the oscillator clock signal frequency and a multiple thereof when harmonically locked. Frequency synthesizer phase-locked loop 12 generates the oscillator clock signal CLKOUT that is divided down by divide by M counter 24 for comparison by phase detector 16 with the reference clock signal CLKIN as divided down by divide by N counter 14. Characteristics of the inputs to phase detector 16 at periodic points in time, known as alignment times, should occur simultaneously. Alignment here will be discussed with respect to the rising leading edge of the output of divide by N counter 14 and the output of divide by M counter 24, although the invention is not limited thereto.

With clock generation circuit 12 operating to produce an oscillator clock signal, which may be at the desired clock signal frequency or a harmonic frequency, the output of divide by N counter 14 and the output of divide by M counter 24 are at the same frequency. Phase generator circuit 26 receives the divided down oscillator clock signal as an input and generates an output that is a phase of the divided down oscillator clock signal. The phase may be generated in any manner known in the art. In a preferred embodiment, the phase generated is a quadrature phase as quadrature signals are often present for other purposes and are easily used. Phase generation may be a separate circuit as shown or may be part of the oscillator.

The phase of the divided down oscillator clock signal generated by phase generator circuit 26 provides the clock input to a shift register such as D flip-flop 18. Flip-flop 18 provides an output that is either a logic one or a logic zero that can be input to oscillator control 20 directly to control the phase-locked loop or can be decoded by harmonic decode circuit 28. Harmonic decode circuit 28 decodes the output from the shift register as described in more detail below to ascertain whether the phase-locked loop is locked to a harmonic of the desired clock signal, and if so to which harmonic it is locked. Harmonic decode circuit 26 can provide an output in any known manner to identify the harmonic to which the phase-locked loop is locked, such as binary.

Figure 3:
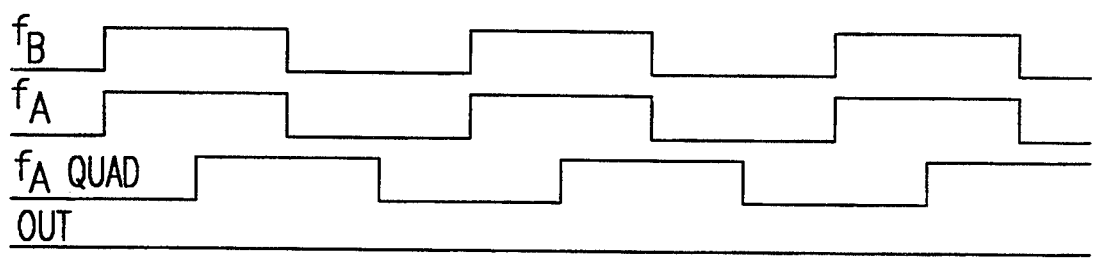
FIG. 3 is a graphical diagram showing harmonic lock detection using quadrature phase.

A representative divided down reference clock signal output from divide by N counter 14 is shown in FIG. 3, as signal $f_B$. A representative divided down desired clock signal output from divide by M counter 24 is shown in FIG. 3, as signal $f_A$. Signals $f_A$ and $f_B$ have the same frequency. Signal $f_{A\ QUAD}$ is signal $f_A$ phase delayed by 90° by phase generator circuit 26. Signal OUT represents the output from the shift register and, with these inputs to the shift register, is a sequence of logic ones.

With the above understanding of the operation of the circuit of FIG. 1, the operation of the circuit of FIG. 2 has also been explained. Reset 34 detects when the output of shift register 18 does not remain all logic ones, corresponding to the frequency generator locking onto a harmonic frequency, and forces the frequency generator to a lower frequency of operation. The output from the shift register could also be provided to a harmonic decode circuit (not shown) in FIG. 2 to determine which harmonic the frequency generator locks onto.

Harmonic decode circuit 28, shown in FIG. 1, decodes the sequence of logic ones to indicate the phase-locked loop has locked onto the desired clock signal frequency. When each output from the shift register is repetitive of the previous states, the phase-locked loop has locked onto the desired clock signal frequency. In the preferred embodiment, the sequence of logic ones provides the sufficient condition to be certain that the phase-locked loop has locked onto the desired clock signal frequency. Since the phase-locked loop locked onto the desired clock signal frequency, no oscillator control action is initiated based on the output from shift register 18.

Figure 4:
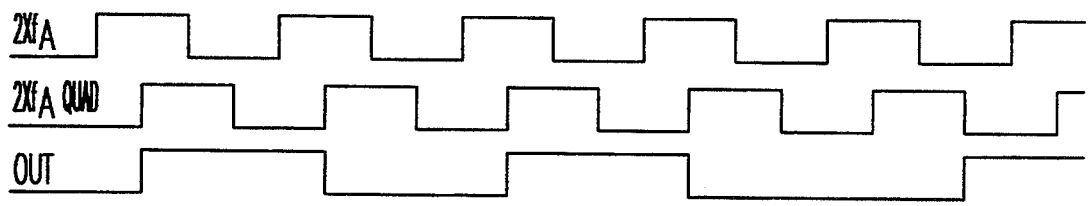
FIG. 4 is a graphical diagram showing the second harmonic and quadrature signal as well as the shift register output.

The second harmonic of signal $f_A$ is represented in FIG. 4. The second harmonic, designated $2 \times f_A$, by definition is twice the frequency of signal $f_A$. The rising leading edge of every other cycle of the second harmonic occurs concurrently with the rising leading edge of the desired clock signal. The concurrent occurrence of this characteristic permits the phase-locked loop to harmonically lock. If the phase-locked loop harmonically locks onto the second harmonic, the phase generator circuit would produce a phase delayed signal, such as signal $2 \times f_{A\ QUAD}$, at the same frequency as the second harmonic but phase shifted therefrom, preferably 90°. With these inputs to the shift register, the shift register provides an output, OUT, shown in FIG. 4 that is a repetitive sequence of logic states, 101010.

Since the shift register output does not remain at a constant level, in the preferred embodiment at the level of a logic 1, corrective oscillator control action is necessary. Harmonic decode circuit 28 decodes the sequence of logic states. Circuit 28 detects that the sequence of logic states output from the shift register repeats each two logic states, indicating the phase-locked loop has harmonically locked onto the second harmonic. Alternatively, in a digital oscillator control, a register may be reset to a low state to force the oscillator control to shift operation of the oscillator to another frequency and allow operation of the phase-locked loop to hopefully settle in on and lock to the desired clock signal frequency. In an analog control, the voltage would be lowered to force the phase-locked loop out of harmonic lock to a lower frequency of operation.

Figure 5:
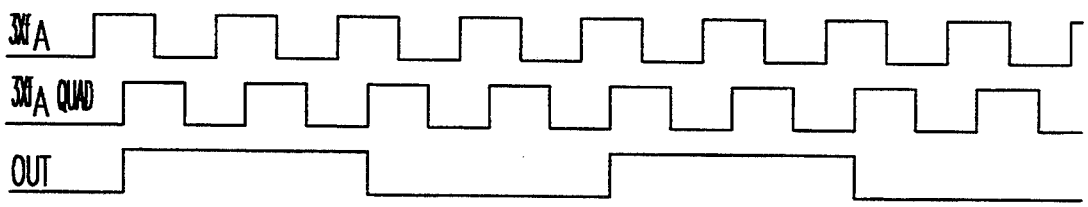
FIG. 5 is a graphical diagram showing the third harmonic and quadrature signal as well as the shift register output.
Figure 6:
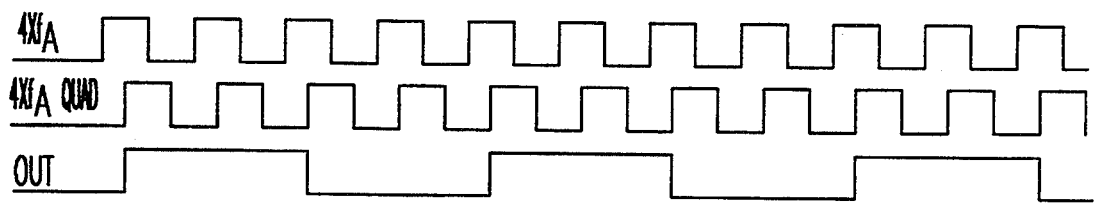
FIG. 6 is a graphical diagram showing the fourth harmonic and quadrature signal as well as the shift register output.

The third and fourth harmonics of signal $f_A$ are shown in FIGS. 5 and 6, respectively. Like the second harmonic signal, the third ($3 \times f_A$) and fourth ($4 \times f_A$) harmonic signals have rising leading edges, every third and fourth cycle, respectively, that occur concurrently with the rising leading edge of the divided down oscillator clock signal. Shown with the third harmonic in FIG. 5 is a 90° phase shifted third harmonic $3 \times f_{A\ QUAD}$ and the output, OUT. Thus, if the third harmonic is generated by clock generation circuit 12 and the phase-locked loop harmonically locks onto the third harmonic, the output OUT of the shift register would be a repetitive sequence of 110110 which could be used to take direct oscillator control action as described above. Circuit 28 detects that the sequence of logic states output from the shift register repeats each three logic states, indicating the phase-locked loop has harmonically locked onto the third harmonic.

Shown with the fourth harmonic in FIG. 6 is a 90° phase shifted fourth harmonic $4 \times f_{A\ QUAD}$ and the output, OUT. If the fourth harmonic is generated by the clock generation circuit 12 and the phase-locked loop harmonically locks onto the fourth harmonic, the output, OUT, of the shift register would be a repetitive sequence of 11001100 which could be used to take direct oscillator control action as described above, or could be decoded by harmonic decode circuit 28. Circuit 28 detects that the sequence of logic states output from the shift register repeats each four logic states, indicating the phase-locked loop has harmonically locked onto the fourth harmonic.

Figure 7:
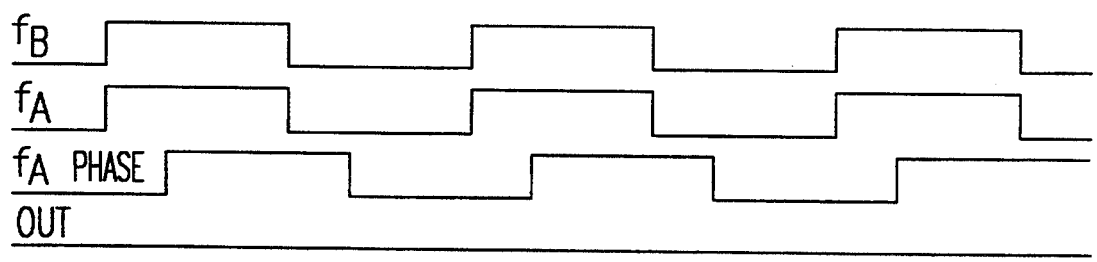
FIG. 7 is a graphical diagram, similar to FIG. 3, showing harmonic lock detection using a phase other than a quadrature phase.

FIG. 7 illustrates that the phase of signal $f_A$ need not be the quadrature phase for the harmonic lock detector circuit to detect harmonic locking. Signals $f_A$ and $f_B$ from FIG. 3 are repeated. A phase shifted $f_{A\ PHASE}$ having the same frequency as signal $f_A$, phase delayed by approximately 60° is shown. Also shown is the output OUT from the shift register with signal $f_A$ as the D input and signal $f_{A\ PHASE}$ as the clock input. The output is a sequence of logic ones indicating that the phase-locked loop has locked onto the desired clock signal frequency. It can be observed from FIGS 1 and 7 that when using a shift register clocked by a rising leading edge, any phase shift between 0° and 180° will suffice, where the rising leading edge of signal $f_{A\ PHASE}$ is a sufficient distance from either the rising or falling edges of signal $f_B$ to avoid ambiguity.

Those skilled in the art can easily implement the phase-locked loop harmonic lock detector circuit in silicon.

While the invention has been described as being implemented by an integrated circuit, it is recognized that other embodiments of the invention could be software implemented. Although the invention has been described as an integrated circuit, the invention could be part of a system. The shift register in the disclosed embodiment of the invention has been described as being clocked by a signal having a rising leading edge. Those skilled in the art can modify the disclosed circuit to accommodate a shift register clocked by a falling leading edge.

I claim:

1. An integrated circuit for detecting harmonic lock of a phase-locked loop comprising:
   a frequency synthesizer for receiving a reference clock signal and a control signal, the frequency synthesizer for generating an oscillator clock signal defining a frequency;
   a phase generator for receiving the oscillator clock signal and for generating a phase of the oscillator clock signal; and
   a shift register for receiving the reference clock signal as an input and for receiving the phase of the oscillator clock signal as a clock signal, the shift register providing an output that is a sequence of logic states, the shift register output providing the control signal to the frequency synthesizer to change the frequency of the oscillator clock signal when the frequency synthesizer is harmonically locked.

2. An integrated circuit as recited in claim 1, wherein the shift register is a flip-flop.

3. An integrated circuit as recited in claim 1, wherein the phase generator is a quadrature generation circuit.

4. An integrated circuit as recited in claim 1, further comprising:
   a first divide down counter for receiving the oscillator clock signal and for providing a divided down oscillator clock signal to the phase generator.

5. An integrated circuit as recited in claim 1, further comprising:
   a first divide down counter for receiving the reference clock signal and for providing a divided down reference clock signal to the frequency synthesizer and the shift register.

6. An integrated circuit as recited in claim 5, further comprising:
   a second divide down counter for receiving the oscillator clock signal and for providing a divided down oscillator clock signal to the phase generator.

7. An integrated circuit as recited in claim 1, further comprising: a harmonic decode circuit for receiving and decoding the sequence of logic states output from the shift register to ascertain the harmonic to which the phase-locked loop is locked.

8. A system including a circuit for detecting harmonic lock of a phase-locked loop, comprising:
   a frequency synthesizer for receiving a reference clock signal and a control signal, the frequency synthesizer for generating a phase of an oscillator clock signal having a frequency; and
   a shift register for receiving the reference clock signal as an input, and for receiving the phase of the oscillator clock signal as a clock signal, the shift register providing an output that is a sequence of logic states, the shift register output providing the control signal to the frequency synthesizer to change the frequency of the oscillator clock signal when the frequency synthesizer is harmonically locked.

9. A system as recited in claim 8, wherein the shift register is a flip-flop.

10. A system as recited in claim 8, further comprising:
    a first divide down counter for receiving the reference clock signal and for providing a divided down reference clock signal to the frequency synthesizer and the shift register.

11. A system as recited in claim 8, further comprising a harmonic decode circuit for decoding the sequence of logic states output from the shift register to ascertain the harmonic to which the phase-locked loop is locked.

12. A method of detecting harmonic lock of a frequency generator, the frequency generator receiving a reference clock signal and a control signal, comprising the steps of:
    generating an oscillator clock signal defining a frequency from a reference clock signal; providing the reference clock signal as the input to a shift register; clocking the shift register with a phase of the oscillator clock signal; decoding the shift register output to ascertain whether the frequency generator is harmonically locked; and
    controlling the frequency of the oscillator clock signal in response to the shift register output to change the frequency of the oscillator clock signal when the frequency generator is harmonically locked.

13. A method as recited in claim 12, further comprising decoding the shift register output to ascertain to which harmonic the frequency generator is locked.

14. A method as recited in claim 12, wherein the step of providing the reference clock signal as the input to a shift register comprises the steps of:
    dividing down the reference clock signal to generate a divided down reference clock signal; and
    providing the divided reference clock signal as the input to the shift register.

15. A method as recited in claim 12, wherein the step of clocking the shift register with a phase of the oscillator clock signal, comprises the steps of:
    dividing down the oscillator clock signal to generate a divided down oscillator clock signal; and
    clocking the shift register with a phase of the divided down oscillator clock signal.

16. A method as recited in claim 15, further comprising the step of generating a phase of the divided down oscillator clock signal.

17. An integrated circuit for determining the harmonic to which a phase-locked loop is locked, comprising:

a frequency synthesizer for receiving a reference clock signal and for generating an oscillator clock signal;

a phase generator for receiving the oscillator clock signal and for generating a phase of the oscillator clock signal;

a shift register for receiving the reference clock signal as an input and for receiving the phase of the oscillator clock signal as a clock signal, the shift register providing an output, and a harmonic decode circuit for receiving the shift register output and for decoding the shift register output to determine which harmonic a phase locked loop in the frequency synthesizer is locked, the harmonic decode circuit providing an output identifying said harmonic.

18. An integrated circuit as recited in claim 17, wherein the harmonic decode circuit is binary.

* * * * *